United States Patent [19]

Gerstenhaber et al.

[11] Patent Number: 4,855,684
[45] Date of Patent: Aug. 8, 1989

[54] BIAS CURRENT COMPENSATION FOR BIPOLAR INPUT STAGES

[75] Inventors: Moshe Gerstenhaber, Newton; Robert J. Libert, Rowley, both of Mass.

[73] Assignee: Analog Devices, Inc., Norwood, Mass.

[21] Appl. No.: 257,716

[22] Filed: Oct. 14, 1988

[51] Int. Cl.[4] ............................................. H03F 3/45
[52] U.S. Cl. .................................... 330/257; 330/261
[58] Field of Search ....................... 330/257, 261, 311

[56] References Cited

U.S. PATENT DOCUMENTS 4,575,685 3/1986 Dobkin et al. ..................... 330/261

OTHER PUBLICATIONS

Product literature for OP-27 Ultra Low Noise Precision OP AMP produced by Precision Monolithics, Inc., 1500 Space Park Drive, Santa Clara, California 95050.
G. Erdi, *Amplifier Techniques for Combining Low Noise, Precision, and High-Speed Performance*, IEEE Journal of Solid-State Circuits, vol. SC-16, No. 6, Dec. 1981.
*Product Specification OP-05 Series Instrumentation Grade Operational Amplifier*, Raytheon Corp, 141 Spring Street, Lexington, Massachusetts 02173.
D. P. Laude, *A Low-Noise High-Precision Operational Amplifier*, IEEE Journal of Solid-State Circuits, vol. SC-16, No. 6, Dec. 1981.

Primary Examiner—James B. Mullins
Attorney, Agent, or Firm—Wolf, Greenfield & Sacks

[57] ABSTRACT

The invention provides a circuit which substantially cancels the input bias current of an operational amplifier having a cascoded NPN-PNP inmput stage. The compensation circuit comprises three transistors. A first NPN transistor is coupled to the input stage such that its collector is coupled to the positive voltage source of the operational amplifier and its emitter is coupled to the emitter of the dual-collector transistor of the input stage. The second transistor, a PNP transistor, has its base coupled to the base of the dual-collector transistor and its collector coupled to the bases of both of the NPN transistors of the input stage, which form the inputs of the operational amplifier. This PNP transistor's emitter is coupled to the collector of a third transistor which is a dual-collector PNP transistor. A third transistor has an emitter coupled to the positive voltage source of the operational amplifier and a base coupled to the base of the NPN transistor of the compensation circuitry. The areas of the two collector regions of the dual collector PNP transistor are ratioed 2:1. This arrangement of three transistors provides a current to the bases of the input transistors substantially equal to the bias current they require; so virtually no external bias current is drawn from the input signals.

6 Claims, 5 Drawing Sheets

BIAS CURRENT COMPENSATION FOR BIPOLAR INPUT STAGES

FIELD OF THE INVENTION

The invention relates to an apparatus and technique for compensating for the bias current of a bipolar input stage for a device such as an operational amplifier. More particularly, the invention relates to a bias current compensation scheme for an NPN-PNP input stage useful, for example, in an operational amplifier.

BACKGROUND OF THE INVENTION

The present invention is useful in many types of circuits employing bipolar input stages to facilitate understanding, however, the following explanation will refer specifically to the input stage of an operational amplifier, it being understood that the invention is applicable to other types of devices as well.

Operational amplifiers are typically considered to comprise at least three stages: an input stage, an intermediate stage and an output stage. The characteristics of an operational amplifier's input stages are among the most critical factors which affect the operational amplifier's voltage gain performance. Error effects introduced in the input stage receive maximum amplification; error effects introduced in later stages are amplified to a much lesser degree.

Figure 1:
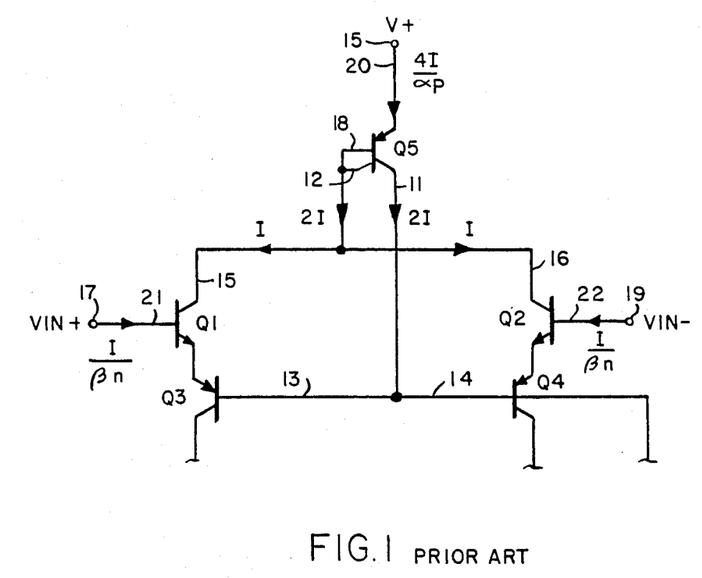
FIG. 1 shows a circuit diagram of an NPN PNP cascoded input stage for an operational amplifier of the prior art.

FIG. 1 shows what is typically called a 741 input stage for an operational amplifier. It is a cascoded NPN PNP input stage. Such input stages are characterized in that they comprise a pair of NPN input transistors Q1 and Q2 cascoded with a pair of PNP transistors Q3 and Q4. They further comprise a dual collector PNP transistor Q5 having a first collector 11 coupled to the bases 13 and 14 of the PNP transistors Q3 and Q4, respectively, and a second collector 12 coupled to the collectors 15 and 16 of the NPN transistors Q1 and Q2, respectively. The two collector regions of transistor Q5 are of equal size and characteristics (i.e., ratioed 1:1) such that the current flowing through one collector terminal is approximately equal to the current flowing through the other collector terminal. Further, the base 18 of the dual collector transistor Q5 is also coupled to the collectors 15 and 16 of transistors Q1 and Q2. The emitter 20 of transistor Q5 is directly coupled to the positive voltage source (V+) of the operational amplifier, applied on line 15. The bases 21 and 22 of NPN transistors Q1 and Q2 are coupled to the non-inverting input 17 and inverting input 19, respectively, of the operational amplifier.

Theoretically, the inputs 17 and 19 to an operational amplifier are a infinite impedance as seen by the external circuitry such that no current flows into either input. However, as is obvious from FIG. 1, a small but frequently non negligible bias current, $I/\beta_n$, flows into the bases 21 and 22 of transistors Q1 and Q2 ($\beta_n$ representing the current gain, or "beta", of the transistors).

Figure 2:
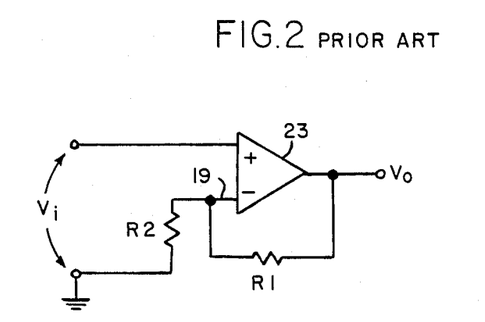
FIG. 2 shows an operational amplifier having an input stage as shown in FIG. 1 embodied in a circuit of the prior art.

Referring now to FIG. 2, an operational amplifier 23 is shown embodied in a circuit which operates essentially as a voltage controlled voltage source—i.e., an amplifier with voltage gain. Using ideal (unrealizable) components, the voltage response of the operational amplifier in this circuit is given by the equation $$V_o = \left(1 + \frac{R1}{R2}\right) \cdot V_i.$$

The assumed ideal components include the operational amplifier 23, which has zero input current and infinite input impedance. However, as can be seen from FIG. 1, the inverting input 19 of the operational amplifier is coupled to the base 22 of transistor Q2 and therefore, in fact, a small bias current flows into the inverting input 19. In the gain equation above, this bias current has obviously been ignored; the equation, therefore, is merely an approximation of the operation of the physical circuit. Although small, this bias current causes the circuit performance to vary from the ideal performance characteristics given by the equation above; sometimes the departure from ideal is of an unacceptable magnitude. A simple resistive circuit injecting a current equal to the bias current could be added, but such a circuit would be unacceptable since it would lower the input impedance.

Figure 3:
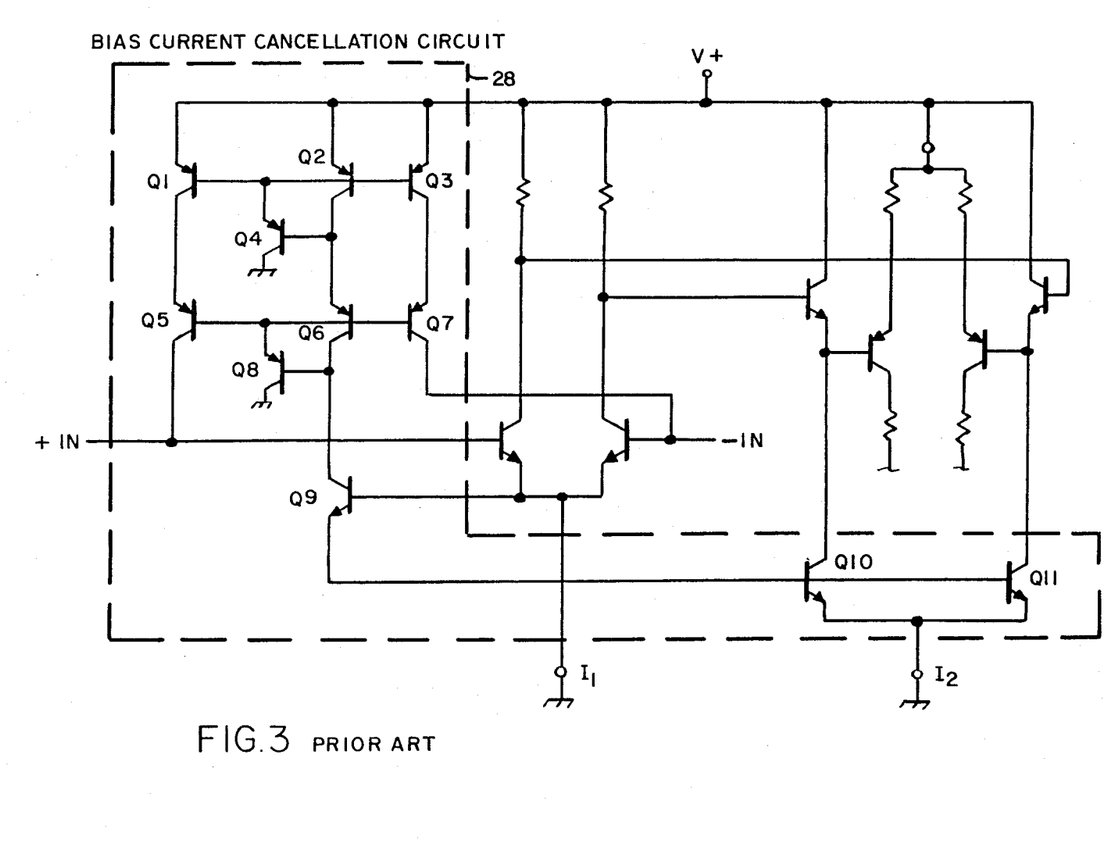
FIG. 3 shows one particular apparatus available in the prior art for canceling bias current which can be used in an NPN-PNP input stage for an operational amplifier.

A few attempts have been made in the prior art to provide, in operational amplifiers, input stage circuitry to compensate for bias current, so as to minimize or reduce this error. One such scheme is exemplified in the OP27 operational amplifier of Precision Monolithics Inc. of Santa Clara, Calif., shown in FIG. 3. Block 28 denotes this bias current cancellation circuitry employed in this particular scheme. A description of the operation of this bias current cancellation circuitry is found in G. Erdi, *Amplifier Techniques for Combining Low Noise, Precision, and High Speed Performance,* IEEE Journal of Solid State Circuits, Vol. SC-16, No. 6, December 1981, p 653. Although this method is effective, as can be seen from FIG. 3, it requires eleven transistors and a substantial penalty in semiconductor area and price.

Other methods of reducing or eliminating input stage bias currents are available, yet have various drawbacks. One method of reducing bias currents is to use FET or JFET components in the input stage. FETs and JFETs have substantially smaller bias currents than do bipolar transistors. However, such components are significantly noisier and are more prone to drift than bipolar transistors. In many situations, the latter condition outweighs the reduction in bias current. Another method known in the prior art is the use of "super $\beta$" components to replace the normal bipolar components. However, these components display low breakdown voltage, which drastically limits their practical use in operational amplifiers. Further, super $\beta$ input transistors are undesirable because the noise performance of a super $\beta$ transistor is considerably worse than that of an equivalent NPN transistor.

Therefore, it is an object of the present invention to provide an inexpensive apparatus and technique for compensating for bias currents in NPN PNP input stages of operational amplifiers.

It is a further object of the present invention to provide an apparatus which injects bias current into the bases of the input transistors of an input stage while maintaining a high input impedance.

SUMMARY OF THE INVENTION

The invention provides a circuit which substantially cancels the input bias current in an operational amplifier having a cascoded NPN PNP input stage, yet it comprises only three transistors. An NPN-PNP cascaded input stage comprises five transistors: the cascoded NPN and PNP transistor pairs and a dual collector PNP transistor having its base and a first collector coupled to the collectors of the NPN transistors and its second collector coupled to the base of the PNP transistors. The emitter of the dual collector PNP transistor is normally coupled to the positive voltage source of the operational amplifier. In an NPN PNP cascoded input stage, the bases of the NPN transistors constitute the inverting and non-inverting inputs of the operational amplifier. The compensation circuitry of the present invention comprises three transistors. A first NPN transistor is coupled to the NPN PNP input stage such that its emitter collector path intervenes between the emitter of the dual-collector PNP transistor of the input stage and the positive voltage source of the operational amplifier. Its collector is coupled to the positive voltage source of the operational amplifier and its emitter is coupled to the emitter of the dual collector transistor of the input stage. A second transistor, this one a PNP transistor, has its base coupled to the base of the dual-collector transistor and its collector coupled to the base of either one or both of the PNP transistors, depending on whether bias currents compensation is to be provided for one or both NPN transistors This transistor's emitter is coupled to the collector of a third transistor of the compensation circuitry, which is a dual collector PNP transistor. This third transistor has an emitter coupled to the positive voltage source of the operational amplifier and its base coupled to the base of the first transistor of the compensation circuit. The two collector regions of the dual collector PNP transistor are ratioed such that one collector region is one quarter the size of the other if one input to the operational amplifier is to receive bias current compensation (or one half the size of the other if both inputs of the operational amplifier are to receive bias current compensation). Essentially, this assures that, under most circumstances, the current flowing in one of the collector terminals will be one quarter (or one half) the current flowing in the other collector terminal.

This simple arrangement causes a current to flow in the collector of the second transistor (i.e. the PNP transistor) that is equal to (or double) the bias current at the input of the operational amplifier. If the collector regions of the dual collector PNP transistor of the compensation circuitry are ratioed at 4:1, then the current flowing out of the compensation circuitry through the collector of the PNP transistor is approximately equal to the bias current caused to flow in each input of the operational amplifier. If the collector regions of the dual-collector PNP transistor of the compensation circuitry are ratioed at 2:1, then the current flowing out of the compensation circuitry through the collector of the PNP transistor is approximately equal to twice the bias current caused to flow in each input of the operational amplifier. This current can then be split evenly between the operational amplifier inputs so as to provide nearly full compensation at both inputs.

The invention will be more fully understood from the detailed description, which should be read in conjunction with the accompanying drawing. This description is presented by way of example only, the invention being defined only by the claims appended to the end of the description.

DETAILED DESCRIPTION OF THE INVENTION

Figure 4:
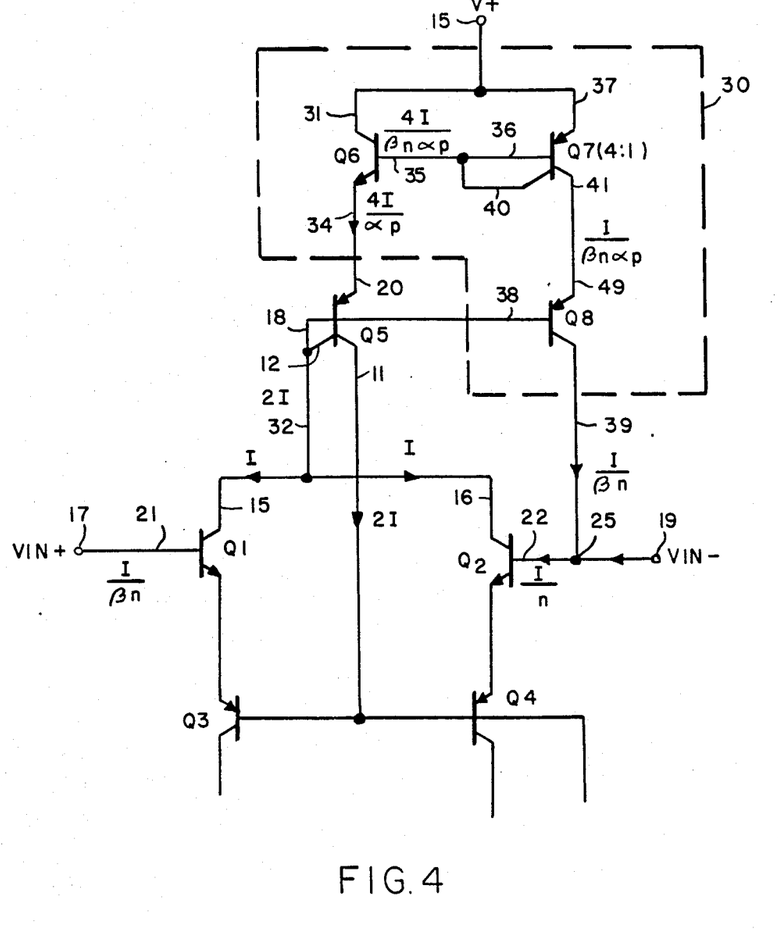
FIG. 4 shows an NPN-PNP input stage embodying the present invention.

FIG. 4 shows an NPN-PNP input stage embodying the present invention. As can be seen, FIG. 4 shows the prior art input stage shown in FIG. 1 with the addition of the components shown in block 30. The bias current compensation circuitry 30 comprises three transistors. Transistor Q6 is an NPN transistor coupled to the input stage such that its collector 31 is coupled to the V+ source of the operational amplifier on line 15 and its emitter 34 is coupled to the emitter 20 of Q5, the dual-collector PNP transistor of the input stage. The base 35 of transistor Q6 is coupled to the base 36 and one collector 40 of transistor Q7. Transistor Q7 is a PNP transistor having a dual-collector. The emitter 37 of transistor Q7 is coupled to the V+ source while the second collector 41 is coupled to the emitter 49 of PNP transistor Q8. The base 38 of transistor Q8 is coupled to the base 18 of transistor Q5 of the input stage. The collector 39 of transistor Q8 is coupled to the inverting input of the operational amplifier, i.e., the base 22 of transistor Q2. In this particular embodiment, dual collector transistor Q7 is chosen to have a 4:1 collector region ratio. Therefore, for any given operating condition, the current flowing in the first collector 40 of transistor Q7 is four times the current flowing in its second collector 41.

To a first approximation, the inverting and non inverting inputs of an operational amplifier are at the same voltage level at any given instant in time. There may, however, be a small differential voltage between these inputs. The output of the operational amplifier then generates signal that is a function of the voltage difference between the two input signals. The exact relation of the output signal to the signals at the inputs of the operational amplifier is determined by the manner in which the operational amplifier is coupled to the other components in the circuit.

Since the voltages at the inverting and non inverting inputs 17 and 19 are substantially equal at all times and transistors Q1 and Q2 are matched, the bias currents which flow into the bases 21 and 22 of transistors Q1 and Q2 should be essentially equal under all normal load conditions.

The ratios of the base current, collector current and emitter current of any given transistor can be given by the following model equations;

$$\alpha = \frac{I_C}{I_E} \quad \beta = \frac{I_C}{I_B}$$

$$\alpha = \frac{\beta}{\beta + 1}$$

where
 $I_c$=collector current,
 $I_E$=emitter current, and
 $I_B$=base current.

In these equations, $\alpha$ is the ratio of the collector current to the emitter current, while $\beta$ is the ratio of the collector current to the base current. For bipolar NPN transistors, $\beta$ is typically in the range of approximately 200–300 whereas for bipolar PNP transistors, $\beta$ is typically about range of 60–75. In a monolithically constructed circuit, all PNP transistors will have $\alpha$ and $\beta$ values that are extremely close to one another and all NPN transistors likewise will have extremely close $\alpha$'s and $\beta$'s. Therefore, all NPN transistors in the circuit in FIG. 4 have equal $\alpha$ and $\beta$ values and all PNP transistors have equal $\alpha$ and $\beta$ values. The symbols $\alpha_n$ and $\beta_n$ will be used herein to denote these values for the NPN transistors and $\alpha_n$ and $\beta_p$ will be used to denote these values for the PNP transistors of the circuit.

The operation of the current compensation circuitry will now be explained in detail. If the current flowing into the collector 15 of transistor Q1 is called I, then the current flowing into the base 21 of transistor Q1 is given by $I/\beta_n$. Since the bias voltage at the non inverting input of an operational amplifier is substantially equal to the bias voltage at the inverting input, the current flowing into the collector 16 of transistor Q2 is also approximately I. Therefore, the current flowing into the base of transistor Q2 is approximately $I/\beta_n$.

Given the fact that the current into the collectors of each of transistors Q1 and Q2 is I, the current flowing in line 32 of the circuit is 2I. Further, FIG. 4 shows that the current in line 32 comprises the current flowing through the base 18 and second collector 12 of transistor Q5. Since the base current of transistor Q5 is small in comparison to the collector current, the base current will be assumed to be zero and all current flowing in line 32 will be assumed to be collector current for the purposes of this analysis. Since the collector regions of transistor Q5 are ratioed 1:1 and the current in the second collector 12 is 2I, the current flowing in the first collector 11 is also 2I. The sum of the currents flowing in collectors 11 and 12, i.e., 4I, is the total collector current, $I_{CQ5}$, of transistor Q5. Therefore, the current caused to flow through the emitter 20 of Q5 is given by $$I_{EQ5} = \frac{I_{CQ5}}{\alpha_p} = \frac{4I}{\alpha_p}.$$

As can be seen from FIG. 4, this current, $I_{EQ5}$, is also the emitter current of transistor Q6. Therefore, the base current of transistor Q6 is given by the following equations:

$$I_{CQ6} = \alpha_n I_{EQ6} \text{ and } I_{BQ6} = \frac{I_{CQ6}}{\beta_n}$$

Therefore, $$I_{BQ6} = \frac{\alpha_n}{\beta_n} \cdot I_{EQ6} = \frac{\alpha_n 4I}{\beta_n \alpha_p}$$

Since $\alpha_n$ is substantially equal to 1 in relation to the other figures in the equation, including $\alpha_p$, this equation may be simplified to $$I_{BQ6} = \frac{4I}{\beta_n \alpha_p}$$

As can be seen in FIG. 4, this current also comprises the current flowing in the base 36 and first collector 40 of dual collector transistor Q7, which has a 4:1 collector region ratio, as explained above. The base current of transistor Q7, being negligibly small in comparison to the current in the first collector, will be ignored in the analysis herein as was done in relation to transistor Q5. Therefore, the current flowing through the second collector 41 of Q7 is approximately one quarter $I_{BQ6}$, i.e.

$$I_{CQ7} = \frac{I}{\beta_n \alpha_p}$$

This collector current for transistor Q7 is also the emitter current for transistor Q8. Thus the current in the collector 39 of transistor Q8 is given by:

$$I_{CQ8} = \alpha_p \cdot I_{EQ8} = \alpha_p \cdot \frac{I}{\beta_n \alpha_p} = \frac{I}{\beta_n}$$

As can be seen in FIG. 4, the result, $I/\beta_n$, is equal to the original bias current contribution to the inputs of the operational amplifier. As shown, the collector current of transistor Q8, is injected into node 25 at the base of transistor Q2. A simple nodal analysis of node 25 shows that the current flowing into the inverting input 19 from external circuitry must be zero. In actuality, the input bias current is not reduced exactly to zero, since several approximations were made in the above analysis, and certain error factors were ignored. However, the bias current compensation scheme disclosed herein operates to cancel about 80% or more of the bias current required by transistor Q2.

Thus, as described above the simple structure of the transistors in block 30 compensates for the bias current at the inverting input of the input stage of the operational amplifier. Further, the apparatus of FIG. 4 can be easily adapted to compensate for bias currents a the non-inverting input, as well.

Figure 5:
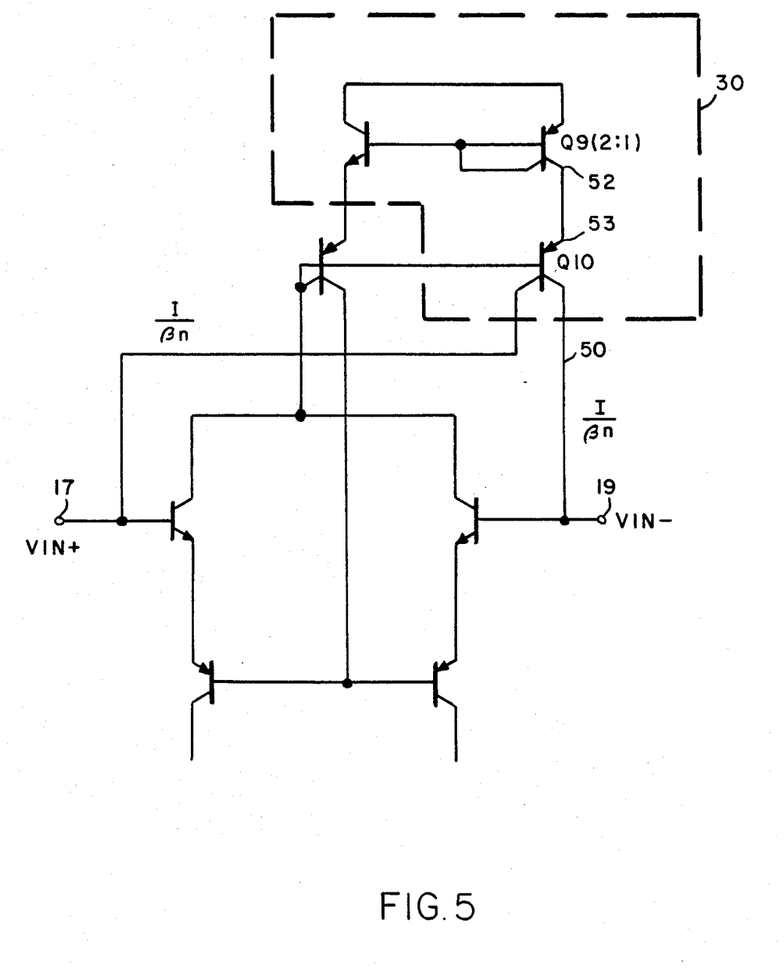
FIG. 5 shows an alternate embodiment of the present invention used in an NPN PNP input stage.

FIG. 5 shows an alternative embodiment of the present invention wherein compensation is provided for the bias currents at both the inverting and non-inverting inputs 17 and 19. The only alterations necessary to adapt the apparatus of FIG. 4 to operate so as to compensate for both bias currents is to replace transistor Q7 with transistor Q9, which has a collector region area ratio of 2:1 rather than 4:1. Further, transistor Q8 is replaced by a dual collector transistor Q10 having a 1:1 ratio of collector regions. The first collector 50 of transistor Q10 is connected to the inverting input 19, as was done in FIG. 4, and the second collector 51 of transistor Q10 is connected to the non inverting input 17. Since transistor Q9 has a collector region area ratio of 2:1 rather than 4:1, the current flowing in the collector 52 of transistor Q9 and emitter 53 of transistor Q10 is 2I/-

$\beta_n \alpha_p$ rather than $1/\beta_n \alpha_p$. Accordingly, the total collector current of transistor Q10 in FIG. 5 is $2I/\beta_n$ rather than $I/\beta_n$. As shown in FIG. 5, the two collectors 50 and 51 of transistor Q10 share the collector current equally, thereby sending current $I/\beta_n$ to each of the inverting and non inverting inputs. In all other aspects, the embodiments of FIGS. 4 and 5 are equivalent.

Figure 6:
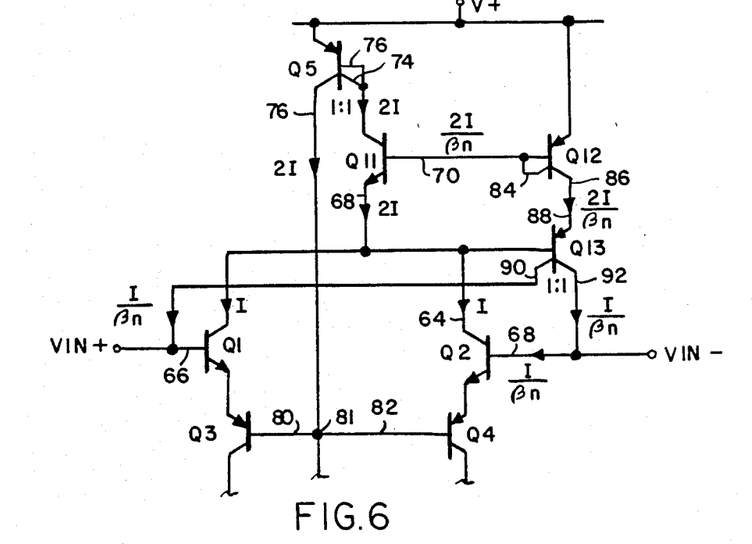
FIG. 6 shows another embodiment of the present invention.

FIG. 6 shows an alternate embodiment of the present invention. The analysis below will show that the embodiment of FIG. 6 provides approximately the same bias current compensation as the embodiments of FIGS. 4 and 5, yet provides certain advantages thereover. Referring to FIG. 6, transistors Q1-Q5, once again, comprise the transistors normally found in an NPN-PNP cascoded input stage. Transistors Q11-Q13 comprise the bias current compensation apparatus. Assuming that the current flowing in the collectors 62 and 64 of transistors Q1 and Q2, respectively, is I, then the current flowing in the bases 66 and 68 of transistors Q1 and Q2, respectively, is $I/\beta_n$. The sum of these two collector currents, 2I, is the current flowing in the emitter 68 of NPN transistor Q11. Accordingly, that the current flowing in the base 70 of transistor Q11 is $2I/\beta_n$. The collector current of transistor Q11 is given by $\alpha_n 2I$, which may be approximated simply by 2I, since $\alpha_n$ is substantially one. This current is also the sum of the current flowing through the first collector 74 and the base 76 of dual collector PNP transistor Q5. Since the base current is very small in comparison to the collector current, the current flowing through collector 74 of transistor Q5 also can be approximated as 2I. Dual collector transistor Q5 has collector regions ratioed at 1:1, and therefore, the current flowing in the second collector 76 of transistor Q5 is also approximately 2I. Therefore, Q5 still supplies a current of approximately 2I to the node 81 at the junction of the bases 80 and 82 of transistors Q3 and Q4, respectively.

Continuing the analysis of the current compensation scheme, the base current of transistor Q11, $2I\beta_n$, also closely approximates the current flowing through the first collector 84 of transistor Q12. Transistor Q12 is a dual collector PNP transistor having a collector region ratio of 1:1. Therefore, the current flowing in the second collector 86 of transistor Q12 is also $2I/\beta_n$. This current is also the current flowing in the emitter 88 of transistor Q13 which is another dual collector PNP transistor having a 1:1 collector region ratio. Given that the emitter current of transistor Q13 is $2I/\beta_n$, the collector current of transistor Q13 is $\alpha_p 2I/\beta_n$. Once again, This may be simplified to $2I/\beta_n$, since $\beta_p$ is approximately 1. Since transistor Q13 is a dual-collector PNP transistor having a 1:1 collector region ratio, the total collector current, $2I/\beta_n$, is split evenly between the first and second collectors 90 and 92 such that current $I/\beta_n$ flows in each collector. As in the FIG. 5 embodiment, the collectors 90 and 92 of transistor Q13 are coupled to the bases 66 and 68, respectively, of transistors Q1 and Q2 so as to compensate for the bias currents flowing therein.

This embodiment of the current compensation scheme affords certain advantages over the embodiments of FIGS. 4 and 5. First, this embodiment requires one $V_{BE}$ less headroom, thereby expanding the allowable input voltage range. In the embodiment of FIG. 6, the headroom between the collectors 62 and 64 of input transistors Q1 and Q2 and the positive voltage source is $V_{BEQ11} + V_{BEQ12}$, whereas in the embodiments of FIGS. 4 and 5, the headroom is $V_{BEQ5} + V_{BEQ6} + V_{BEQ7}$. The elimination of the voltage of one base emitter junction provides approximately 0.65 volts of additional headroom to the input stage. Further, it should be noted that the FIG. 6 embodiment removes the base current of transistor Q5 from the collectors 62 and 64 of transistors Q1 and Q2.

Figure 7:
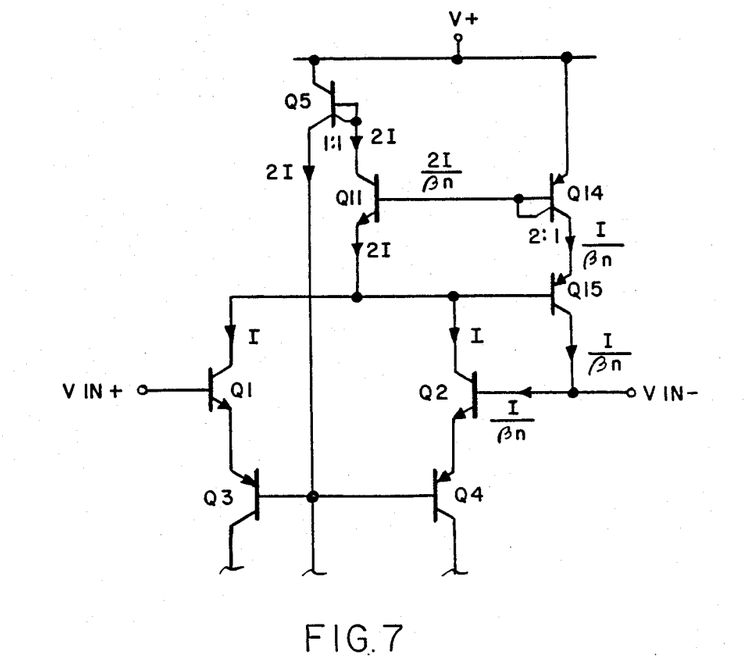
FIG. 7 shows a variation of the embodiment of FIG. 6.

The embodiment of FIG. 6 provides bias current compensation at both of the inputs of the input stage. However, it should be noted that, like the embodiments of FIGS. 4 and 5, the embodiment of FIG. 6 can be adapted to provide compensation at only one of the inputs simply by eliminating one of the collectors of transistor Q13 and replacing transistor Q12 with a dual collector PNP transistor having a 2:1, rather than a 1:1 collector region ratio. Such an apparatus is shown in FIG. 7.

The apparatus of the various embodiments of the present invention utilize only three transistors requiring only two additional isolation pockets in the integrated circuit within which it is embodied. The present apparatus requires substantially less semiconductor area, expense and wiring than the apparatus heretofore known in the prior art for accomplishing bias current compensation in NPN-PNP input stages for operational amplifiers.

Having thus described one particular embodiment of the invention, various alterations, modifications and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. An input stage having an inverting input and a non inverting input, comprising:
   a first NPN transistor having (i) a base coupled to the non inverting input, (ii) a collector, and (iii) an emitter;
   a second NPN transistor having (i) a base coupled to the inverting input, (ii) a collector coupled to the collector of the the first NPN transistor, and (iii) an emitter;
   a first PNP transistor having (i) an emitter coupled to the emitter of the first NPN transistor, (ii) a base, and (iii) a collector:
   a second PNP transistor having (i) an emitter coupled to the emitter of the second NPN transistor, (ii) a base coupled to the base of the first PNP transistor; and (iii) a collector
   a first dual-collector PNP transistor having first and second collector regions of approximately equal area and having (i) a base and a first collector coupled to the collectors of the first and second NPN transistors, (ii) a second collector coupled to the bases of the first and second PNP transistors, and (iii) an emitter;
   a third NPN transistor having (i) an emitter coupled to the emitter of the first dual collector PNP transistor, (ii)
   a collector coupled to a positive voltage source, and (iii) a base;
   a second dual collector PNP transistor having first and second collector regions, the first collector region being approximately four times the size of the second collector, region the dual-collector PNP transistor having (i) a base and a first collector coupled to the base of the third NPN transistor, (ii) an emitter coupled to the positive voltage source (iii) a second collector; and a third PNP transistor having (i) a base coupled to the base of the first dual collector PNP transistor, (ii) an emitter coupled to the second collector of the second dual collector PNP transistor, and (iii) a collector coupled to the base of the second NPN transistor.

2. An input stage for an operational amplifier having an inverting input and a non inverting input, comprising:

a first NPN transistor having (i) a base coupled to the non-inverting input, (ii) a collector, and (iii) an emitter;

a second NPN transistor having (i) a base coupled to the inverting input and (ii) a collector coupled to the collector of the first NPN transistor, and (iii) an emitter;

a first PNP transistor having (i) an emitter coupled to the emitter of the first NPN transistor, (ii) a collector, and (iii) a base:

a second PNP transistor having (i) an emitter coupled to the emitter of the second NPN transistor, (ii) a base coupled to the base of the first PNP transistor, and (iii) a collector;

a first dual collector PNP transistor having first and second collector regions of approximately equal size and having (i) a base and a first collector coupled to the collectors of the first and second NPN transistors, (ii) a second collector coupled to the bases of the first and second PNP transistors, and (iii) an emitter;

a third NPN transistor having (i) an emitter coupled to the emitter of the first dual-collector PNP transistor, (ii) a collector coupled to a positive voltage source, and (iii) a base;

a second dual collector PNP transistor having first and second collector regions, the first collector being approximately twice the size of the second collector region, the second dual collector PNP transistor having (i) a base and a first collector coupled to the base of the third NPN transistor, (ii) an emitter coupled to the positive voltage source, and (iii) a second collector; and a third dual collector PNP transistor having first and second collector regions of approximately equal area the third dual collector PNP transistor having (i) a base coupled to the base of the first dual-collector PNP transistor, (ii) an emitter coupled to the second collector of the second dual-collector PNP transistor, and (iii) first and second collectors coupled to the bases of the first and second NPN transistors, respectively, whereby the current injected into the bases of the first and second NPN transistors from the collectors of the third PNP transistor is equal to the current caused to flow in the bases of the first and second NPN transistors via the inverting and non-inverting inputs of the operational amplifier, respectively.

3. An apparatus for compensating for bias current in an NPN-PNP input stage, said input stage having first and second NPN transistors cascoded with first and second PNP transistors and a first dual collector PNP transistor having (i) a base and a first collector coupled to the collectors of the first and second NPN transistors, (ii) a second collector coupled to the bases of the first and second PNP transistors, and (iii) an emitter, the apparatus comprising:

a third NPN transistor having (i) an emitter coupled to the emitter of the first dual collector PNP transistor, (ii) a collector coupled to a positive voltage source, and (iii) a base;

a second dual-collector PNP transistor having first and second collector regions, the first collector region being approximately four times the size of the second collector region and further having (i) a base and a first collector coupled to the base of the third NPN transistor, (ii) an emitter coupled to a positive voltage source, and (iii) a second collector; and a third PNP transistor having (i) a base coupled to the base of the first dual-collector PNP transistor, (ii) an emitter coupled to the second collector of the second dual collector PNP transistor and (iii) a collector coupled to the base of the second NPN transistor.

4. An apparatus for compensating for bias current in an NPN-PNP input stage of an operational amplifier, said input stage having first and second NPN transistors cascoded with first and second PNP transistors and a first dual collector PNP transistor having (i) a base and a first collector coupled to the collectors of the first and second NPN transistors, (ii) a second collector coupled to the bases of the first and second PNP transistors, and (iii) an emitter, the apparatus comprising:

a third NPN transistor having (i) an emitter coupled to the emitter of the first dual-collector PNP transistor, (ii) a collector coupled to a positive voltage source, and (iii) a base;

a second dual collector PNP transistor having first and second collector regions, the first collector region being twice the size of the second collector region and having (i) a base and the first collector coupled to the base of the third NPN transistor, (ii) an emitter coupled to a positive voltage source for the operational amplifier, and (iii) a second collector; and a third dual collector PNP transistor having first and second collector regions of approximately equal size and further having (i) a base coupled to the base of the first dual-collector PNP transistor, (ii) an emitter coupled to the second collector of the second dual-collector PNP transistor, (iii) a first collector coupled to the base of the first NPN transistor, and (iv) a second collector coupled to the base of the second NPN transistor.

5. An input stage having first and second inputs, comprising:

a first NPN transistor having (i) a base coupled to the first input, (ii) a collector and (iii) an emitter;

a second NPN transistor having (i) a base coupled to the second input, (ii) a collector coupled to the collector of the first NPN transistor and (iii) an emitter;

a first PNP transistor having (i) an emitter coupled to the emitter of the first NPN transistor, (ii) a collector and (iii) a base;

a second PNP transistor having (i) an emitter coupled to the emitter of the second NPN transistor, (ii) a base coupled to the base of the first PNP transistor and (iii) a collector;

a first dual-collector PNP transistor having first and second collector regions of approximately equal size and having (i) a first collector coupled to the bases of the first and second PNP transistors, (ii) an emitter coupled to a positive voltage source, (iii) a base and (iv) a second collector;

a third NPN transistor having (i) a collector coupled to the base and the second collector of the first dual-collector PNP transistor, (ii) an emitter coupled to the collectors of the first and second NPN transistors and (iii) a base;

a second dual collector PNP transistor having first and second collector regions of approximately equal size and having (i) a base and a first collector coupled to the base of the third NPN transistor, (ii) an emitter coupled to the positive voltage source and (iii) a second collector; and a third dual collector PNP transistor having first and second collector regions of approximately equal size, and having (i) an emitter coupled to the second collector of the second dual-collector PNP transistor, (ii) a base coupled to the collectors of the first and second NPN transistors, (iii) a first collector coupled to the first input and (iv) a second collector coupled to the second input.

6. An input stage having first and second inputs, comprising:

a first NPN transistor having (i) a base coupled to the first input, (ii) a collector and (iii) an emitter;

a second NPN transistor having (i) a base coupled to the second input, (ii) a collector coupled to the collector of the first NPN transistor and (iii) an emitter;

a first PNP transistor having (i) an emitter coupled to the emitter of the first NPN transistor, (ii) a collector and (iii) a base;

a second PNP transistor having (i) an emitter coupled to the emitter of the second NPN transistor, (ii) a base coupled to the base of the first PNP transistor and (iii) a collector;

a first dual collector PNP transistor having first and second collector regions of approximately equal size and having (i) a first collector coupled to the bases of the first and second PNP transistors, (ii) an emitter coupled to a positive voltage source, (iii) a base and (iv) a second collector;

a third NPN transistor having (i) a collector coupled to the base and the second collector of the first dual-collector PNP transistor, (ii) an emitter coupled to the collectors of the first and second NPN transistors and (iii) a base;

a second dual collector PNP transistor having first and second collector regions associated with first and second collectors, respectively, the first region being approximately twice the size of the second region, the second dual-collector PNP transistor having (i) a base and the first collector coupled to the base of the third NPN transistor, and (ii) an emitter coupled to the positive voltage source; and a third PNP transistor having (i) an emitter coupled to the second collector of the second dual collector PNP transistor, (ii) a base coupled to the collectors of the first and second NPN transistors and (iii) a collector coupled to the first input.

* * * * *